United States Patent [19] [11] Patent Number: 5,177,576
Kimura et al. [45] Date of Patent: Jan. 5, 1993

[54] DYNAMIC RANDOM ACCESS MEMORY HAVING TRENCH CAPACITORS AND VERTICAL TRANSISTORS

[75] Inventors: Shin'ichiro Kimura, Kunitachi; Tokuo Kure, Tokyo; Toru Kaga, Urawa; Digh Hisamoto, Kokubunji; Eiji Takeda, Koganei, all of Japan

[73] Assignee: Hitachi, Ltd., Tokyo, Japan

[21] Appl. No.: 695,984

[22] Filed: May 6, 1991

[30] Foreign Application Priority Data

May 9, 1990 [JP] Japan .................... 2-117572

[51] Int. Cl.5 ................ H01L 29/68; H01L 27/01; H01L 29/06
[52] U.S. Cl. ........................ 257/71; 257/302
[58] Field of Search ............ 357/23.6 G, 23.7, 55

[56] References Cited

U.S. PATENT DOCUMENTS

| 4,713,678 | 12/1987 | Womack et al. | 357/23.6 G |
|---|---|---|---|
| 4,873,560 | 10/1989 | Sunami et al. | 357/23.6 G |
| 4,914,628 | 4/1990 | Nishimura | 357/23.6 G |
| 4,920,389 | 4/1990 | Itoh | 357/23.6 G |

FOREIGN PATENT DOCUMENTS 61-198772 3/1986 Japan .
61-179571 12/1986 Japan .
63-17553 1/1988 Japan ............ 357/23.6 G
1-149454 6/1989 Japan ............ 357/23.6 G
1-248557 10/1989 Japan .

Primary Examiner—Rolfe Hille
Assistant Examiner—Robert Limanek
Attorney, Agent, or Firm—Antonelli, Terry, Stout & Kraus

[57] ABSTRACT

A vertical semiconductor memory device is provided which capable of miniaturization. More particularly, a memory cell is provided having a trench capacitor and a vertical transistor in a dynamic random access memory suitable for high density integration. An object of this arrangement is to provide a vertical memory cell capable of miniaturization for use in a ultra-high density integration DRAM of a Gbit class. This memory cell is characterized in that each memory cell is covered with an oxide film, an impurity area does not exist on the substrate side, an area in which a channel area is formed is a hollow cylindrical single crystal area, connection of impurity areas as source-drain areas and bit lines and the electrode of a capacitor is made by self-alignment and connection between a word line electrode and a gate electrode is also made by self-alignment.

20 Claims, 14 Drawing Sheets

DYNAMIC RANDOM ACCESS MEMORY HAVING TRENCH CAPACITORS AND VERTICAL TRANSISTORS

BACKGROUND OF THE INVENTION

This invention relates to a semiconductor memory device capable of miniaturization and a fabrication method thereof. More particularly, in a dynamic random access memory (DRAM) suitable for high density integration, the present invention relates to a memory cell structure having a trench capacitor and a vertical transistor and a fabrication method thereof.

The integration density of DRAMs has been quadrupled in the past years or so, and a mass production system of a 4-Mbit DRAM has already been almost ready. This high density integration has been accomplished by miniaturizing a device size.

However, problems such as the drop of a signal-to-noise ratio (S/N) and signal inversion due to irradiation of α-particles have been manifested because of the drop of storage capacitance with miniaturization, as a result, it is a critical problem at present as to how to maintain device reliability.

Therefore, the following two types of memory cells have become predominant for DRAMS of 4-Mbit or more memory capacity as the memory cells that can increase the storage capacitance:

(1) A stacked capacitor memory cell wherein part of storage capacitance is stacked on a switching transistor or a field oxide; and (2) A trench type memory cell wherein a deep trench is formed in a substrate and a charge storage capacitor is formed on its sidewall.

Fabrication of prototypes of 16-Mbit and 64-Mbit memory cells has been attempted by utilizing these three-dimensional memory cells in combination with a self-alignment process. If the memory cell area has to be reduced as has been necessary in the past, however, the memory cell area is as small as 0.5 μm² in a 256-Mbit memory cell. Accordingly, even if the memory structure described above is employed, it is not possible not only to secure sufficient storage capacitance but also to reduce the memory cell area. DRAMs include a capacitor for storing charge, a bit line for supplying the charge to the capacitor and a word line for controlling the flow of the charge, that extends along a channel area, as the minimum unit.

In conventional DRAMs, the charge storage capacitor and the word line have been fabricated planewise on a substrate, or only the capacitor has been formed three-dimensionally. Many memory cells having a structure wherein the word line or, in other words, the channel area in which the charge moves, is formed three-dimensionally have been proposed in order to further reduce the memory cell area. Some of their examples will be explained in detail with reference to FIGS. 1, 2 and 3 of the accompanying drawings.

The memory cell structures for forming the channel in the direction of depth of the substrate can be classified broadly into the following two groups:

(1) A structure wherein a trench is formed in the substrate; and (2) A structure wherein a pillar is left in the substrate.

FIG. 1 shows the example of the type 1 which is disclosed in JP-A-61-179571. The memory cell uses an epitaxial substrate including a layer 31 having a high impurity concentration and a layer 32 having a low impurity concentration, and the capacitor area and the channel area 36 are formed in the high impurity concentration layer and in the low impurity concentration layer, respectively. In accordance with the self-alignment process, one of the electrodes 34 of the charge storage capacitor is connected via region 35 electrically to the channel area, and a capacitor structure is accomplished immediately below the word line.

Here, reference numeral 33 denotes a capacitor insulation film, 37 is a diffusion layer as the bit line, 38 is an inter-layer insulation film and 39 is a word line electrode.

The memory cell shown in FIG. 2 is disclosed in JP-A-61-198772, which improves the memory cell described above. In this arrangement the channel area and the capacitor area are covered completely with the oxide film. In this memory cell the channel area 45 is covered with the oxide film and does not exist on the substrate side. Since the area to which the channel and one of the electrodes of the capacitor are to be connected is covered with the oxide film, too, a leakage current between the memory cells does not occur theoretically. The distance between the memory cells can be reduced drastically when this structure is employed.

The operation speed of the device can be improved because a wiring material having low resistance can be used for the bit lines 48, 49. Reference numeral 41 denotes a high concentration layer, 42 is a low concentration layer, 43 is a capacitor insulation film, 44 is one of the electrodes of the capacitor, 45 is a channel, 46 is a gate insulation film, 47 is an inter-layer insulation film and 50 is a word line electrode. In contrast with the memory cell structure described above, JP-A-1-248557 discloses a memory cell structure which utilizes a pillar formed on a silicon substrate and which is shown in FIG. 3. This prior art technology makes a trench in the substrate in three stages, and utilizes the sidewalls of the pillars formed at these stages as the channel 56, the capacitors 52, 53, 54 and the device-separation 55 from the upper surface in the order named, respectively.

As a result, each memory cell is isolated in self-alignment and this structure is optimal for reducing the distance between the memory cells. The word line 57 can utilize the portion which is left by self-alignment on the sidewall of the silicon pillar at the time of known anisotropic etching. This structure is characterized also in that if the gap between the silicon pillars in the longitudinal direction of the word line is smaller than twice the film thickness of the word line, etching of the word line can be made without any mask. Incidentally, reference numeral 51 denotes the semiconductor substrate, 55 is a high concentration impurity layer which is introduced in order to improve device isolation characteristics and has the same conductivity type as that of the substrate, 56 is the channel area and 58 is the bit line electrode.

SUMMARY OF THE INVENTION

In the memory cell shown in FIG. 1, however, the area 35 for connecting the channel area and one of the electrodes of the charge storage capacitor exists on the substrate side. Therefore, when the distance between the memory cells is small, there occurs the problem that a leakage current increases between the adjacent memory cells. Another problem is that a diffusion layer having large resistance must be used for the bit line. The problem of the leakage current described above does not occur in the memory cell shown in FIG. 2 because the members are covered as a whole by the oxide film but the greatest problem with this memory structure is that the channel area 45 is not a single crystal. Though the channel can be formed by polycrystalline silicon, or the like, the problem of a large leakage current of the channel is left unsolved and this is a critical problem for DRAM which must retain the charge. The memory cell shown in FIG. 3 solves all the problems described above and is therefore one of the most suitable structures for a vertical memory cell. The possibility that etching of the word line can be made without the mask as described above is another advantage of this structure.

However, these excellent features become the problems, on the contrary, when the size of the memory cell is diminished. For example, when the word line is etched without any mask, the gap between the silicon pillars in the direction of the word line as the minimum space define the film thickness of the word line and the film thickness of the word line defines in turn the gap between the silicon pillars in the direction of the bit line that must be isolated. As a result, the gap between the silicon pillars in the direction of the bit line cannot be much reduced and the reduction of the memory cell area is limited eventually.

In accordance with this structure, further, the silicon pillar exists in the trench of the substrate having the step which has substantially the same height as the former at the time of word line etching, so that the word line electrode naturally remains on the entire sidewall of the trench. Accordingly, a buffer layer for connecting the word line to other wiring layers becomes necessary.

For the various reasons described above, it has been difficult to reduce the memory cell area in the conventional vertical memory cells. In other words, the characterizing feature of the vertical memory cell in that the memory cell area can be reduced because the transistor and the capacitor continue in the vertical direction cannot fully be exploited.

FIG. 4 is a sectional view of the memory cell in accordance with the present invention. The characterizing features of the memory cell of the present invention reside in that: (1) each memory cell is covered with an insulation film 9; (2) an impurity area or, in other words, a diffusion layer, does not exist on the substrate side; and (3) unlike the memory cell shown in FIG. 2, the channel area 22 is not polycrystal but is single crystal.

Another characterizing feature of this memory cell is that connection of impurity areas 23, 24 and bit lines 20, 28 and a capacitor electrode 15 are made by self-alignment, and connection between the word line electrode 30 and a gate electrode 26 is made by self-alignment, as well. In order to form a single crystal channel area in the trench covered with the oxide film, the diameter of the trench is expanded inside the substrate, and, after an oxide film is deposited onto its inside wall, a trench is made in the silicon substrate to the depth of this oxide film as will be explained in further detail in later-appearing embodiments of the invention. Accordingly, all the fabrication processes can be carried out in self-alignment by utilizing the technology which makes a trench in the substrate using different kinds of insulation films as the masks.

As a result, a hollow cylindrical silicon single crystal semiconductor area can be formed, and when its channel is connected to one of the electrodes of the capacitor formed in the expanded trench by self-alignment, a vertical memory cell is formed in which both the channel area and the capacitor area are covered with the oxide film. Since the gate electrode 26 is buried into the trench, the problem that etching of the word electrode 30 that defines the gap between the adjacent memory cells does not occur, unlike the memory cell shown in FIG. 3. Since the memory cell has the structure wherein the gate electrode 26 is exposed when the interlayer insulation film 29 is etched back, connection between this word line and the gate electrode buried in the trench can be made by self-alignment, too.

When the structure of the present invention shown in FIG. 4 is employed, the channel area becomes single crystal, and, in comparison with the structure using polycrystalline silicon, or the like, the leakage current flowing through the channel can be reduced drastically. Since this channel area is covered eventually with the oxide film, a so-called SOI (Silicon On Insulator) structure can be accomplished. Moreover, the film is a very thin film of up to 100 nm, and the hollow pillar area in which the channel is formed by the application of a voltage becauses completely depleted.

Accordingly, a transistor having large conductance can be accomplished. This structure is suitable for reducing the memory cell area because the impurity area does not exist on the substrate side and because connection between the channel area and the bit lines and between the channel area and the capacitor electrode and the formation of the word line electrode can be made by self-alignment.

FIG. 5 is a planar layout diagram of the memory cell of the present invention. Assuming that minimum etching space is 0.3 μm, a DRAM cell of approximately 0.5 μm² can be fabricated. The diameter of the trench 65 is 0.5 μm and the width of each of the word lines 67 and the bit line 66 is 0.3 μm. This memory cell area corresponds to that of a 256-Mbit memory cell. Incidentally, in the memory cells having the conventional structures, a DRAM of the 64-Mbit class has been maximum is accordance with a 0.3 μm design rule. Since the memory cell of the present invention can fully utilize self-alignment, the number of necessary masks can be reduced drastically, and the number of masks is essentially only three, that is, the mask for forming the trench 65, the mask for the bit line 66 and the mask for the work line 67, as shown in FIG. 5.

It is an object of the present invention to solve all the problems with the prior art technologies described above.

It is another object of the present invention is to provide a vertical memory cell capable of miniaturization for use in a very high integration density DRAM of a G-bit class.

It is still another object of the present invention to provide a memory cell structure of a completely self-alignment type capable of forming a memory cell by use of only a mask for forming a trench of the memory cell and a fabrication method of such a memory cell.

These and other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Next, preferred embodiments of the present invention will be described with reference to the accompanying drawings.

Figure 6A:
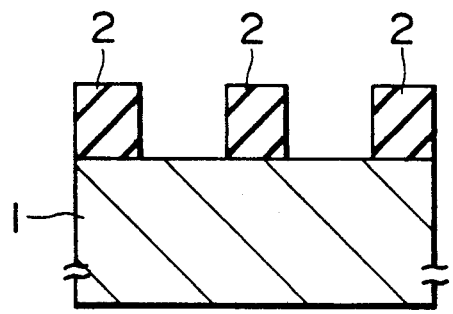
FIGS. 6A through 6V are sectional views, each showing step-wise a fabrication method of the memory cell in accordance with the present invention.
Figure 6B:
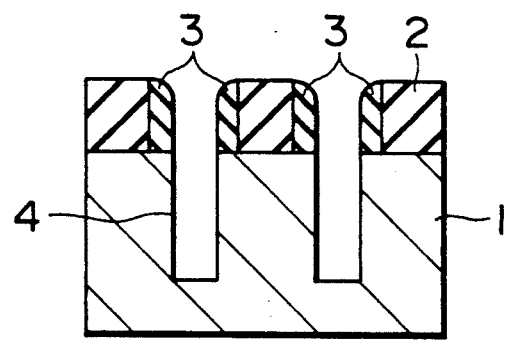
Figure 6C:
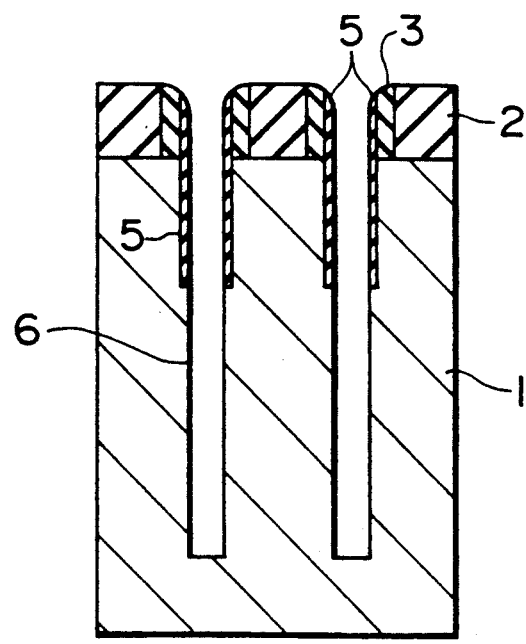
Figure 6D:
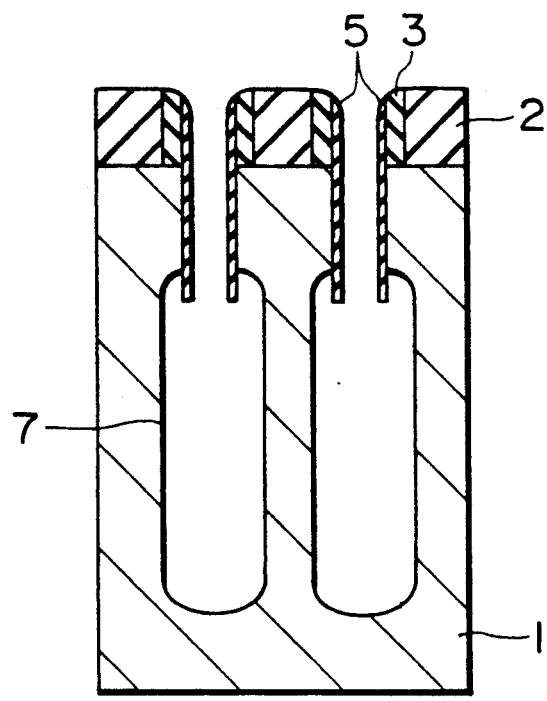
Figure 6E:
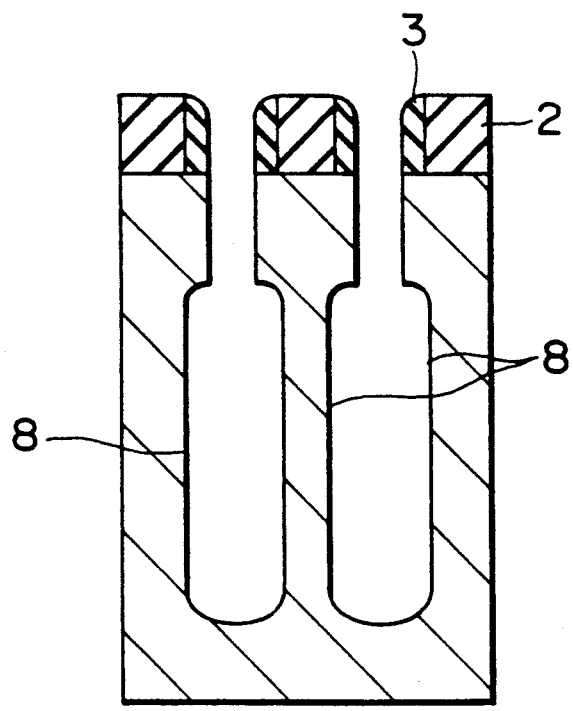
Figure 6F:
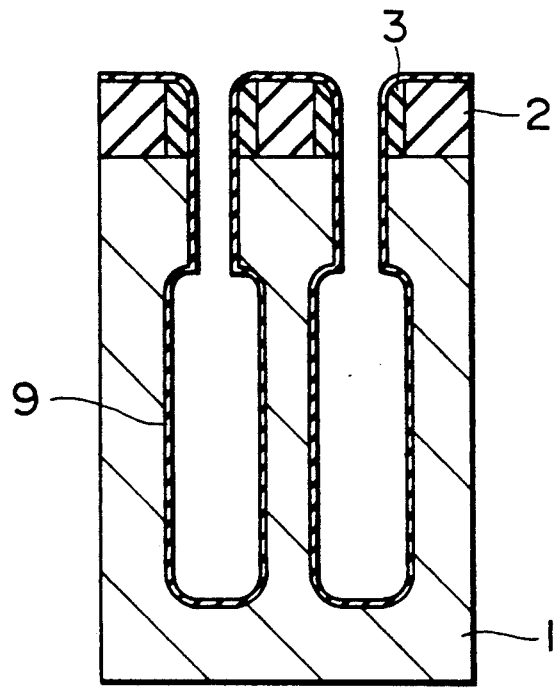
Figure 6G:
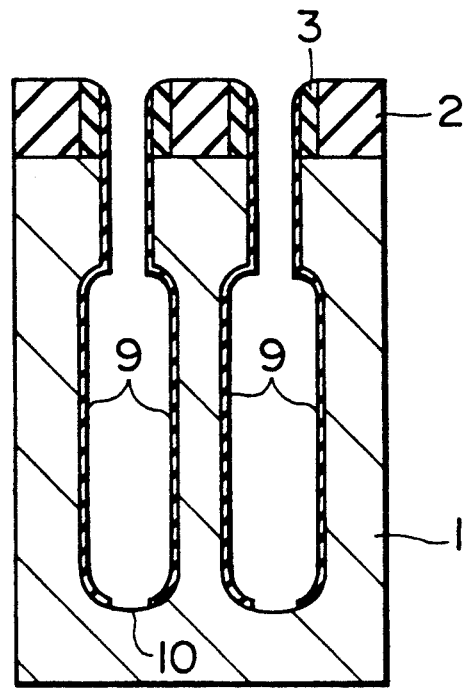
Figure 6H:
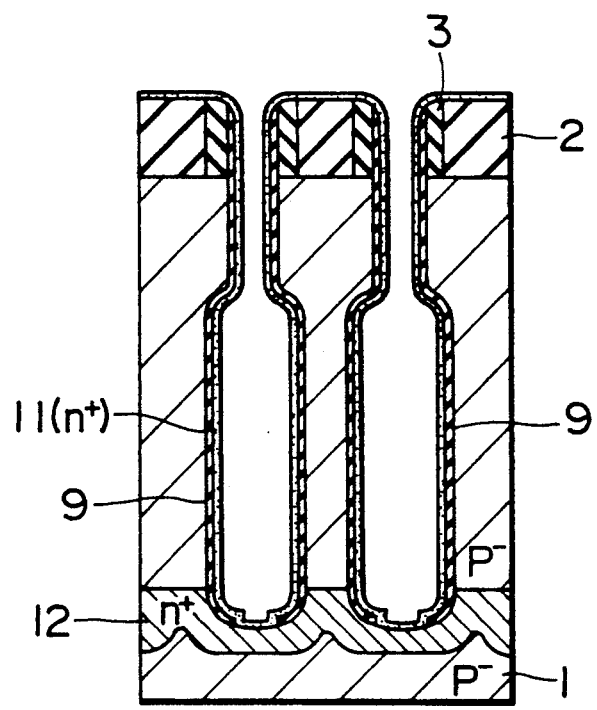
Figure 6I:
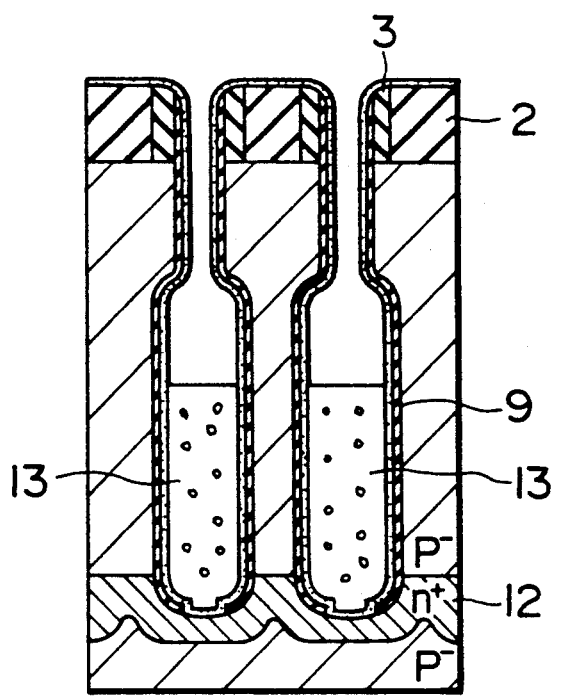
Figure 6J:
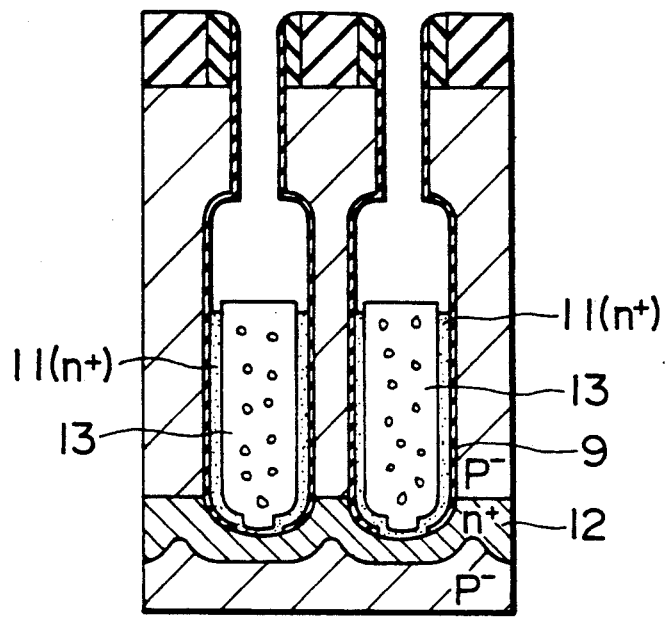
Figure 6K:
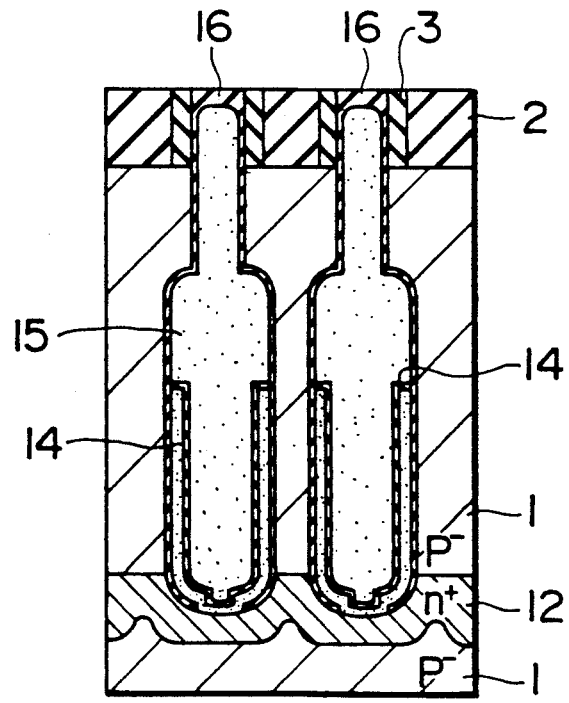
Figure 6L:
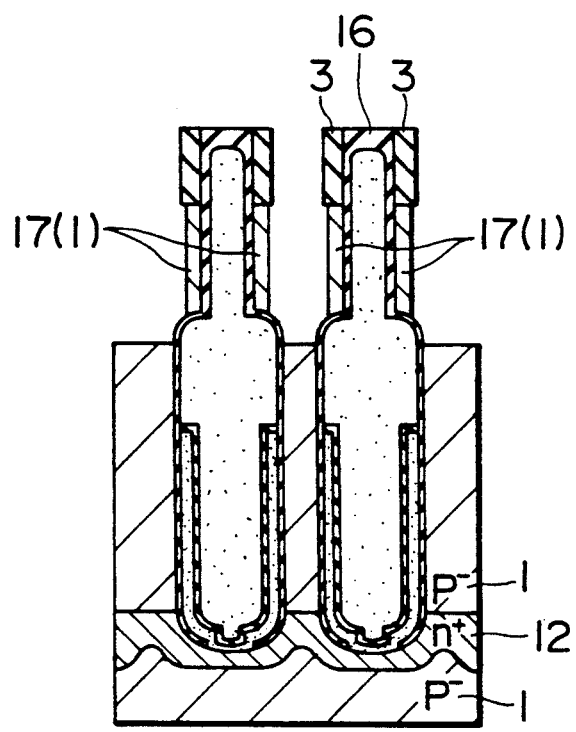
Figure 6M:
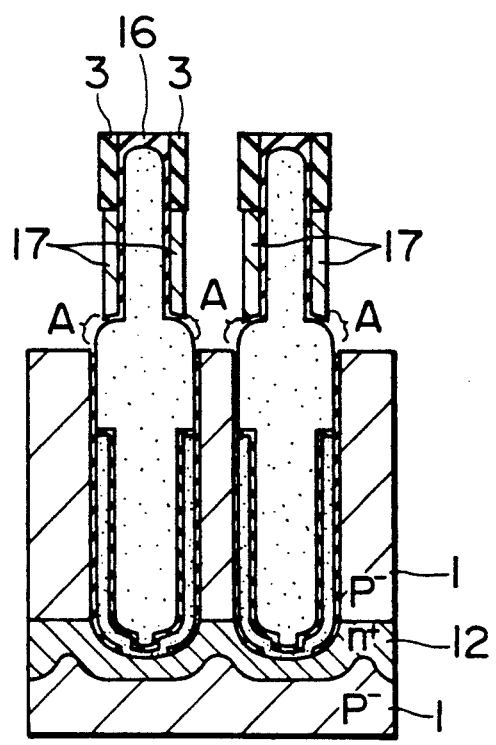
Figure 6N:
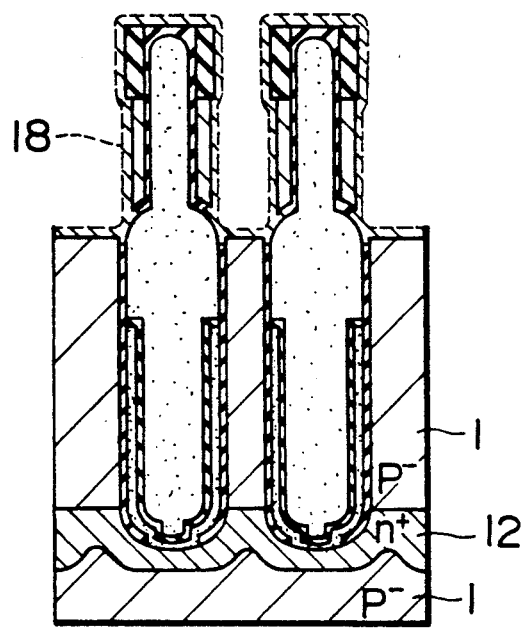
Figure 6O:
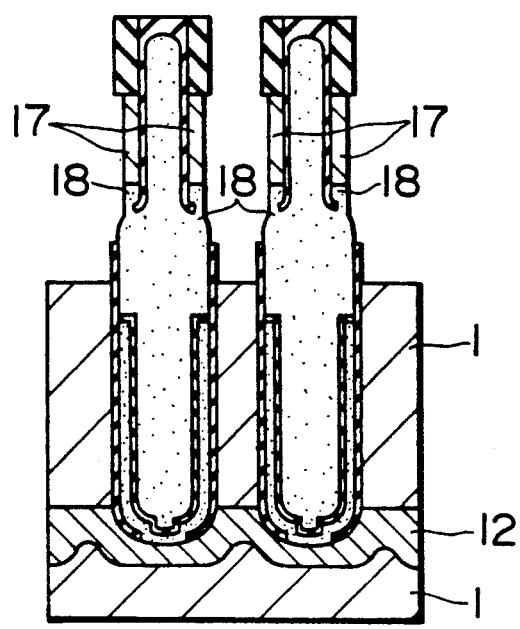
Figure 6P:
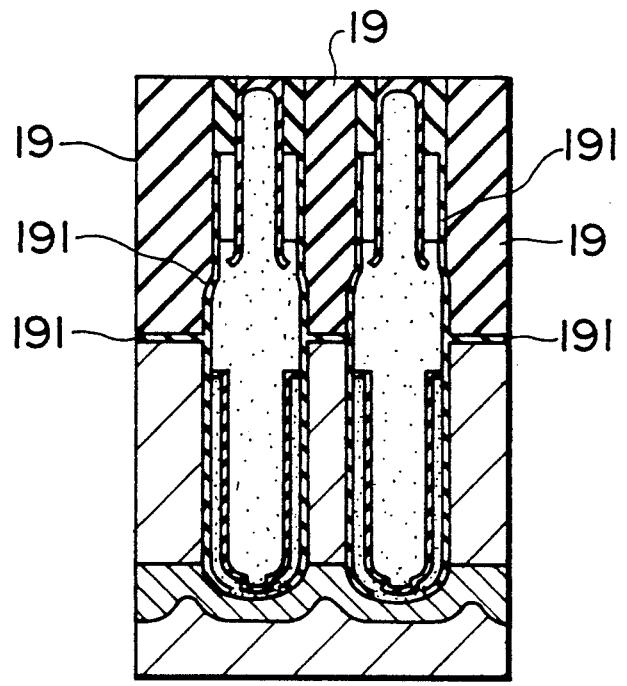
Figure 6Q:
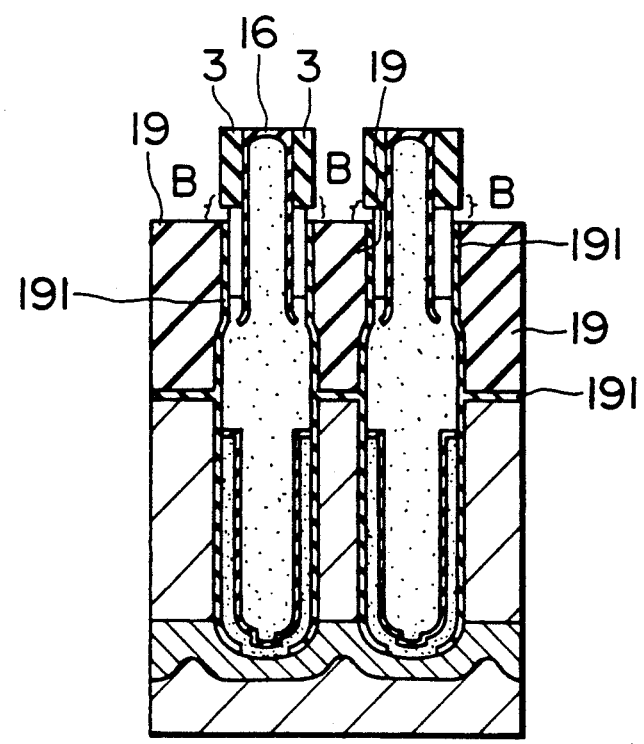
Figure 6R:
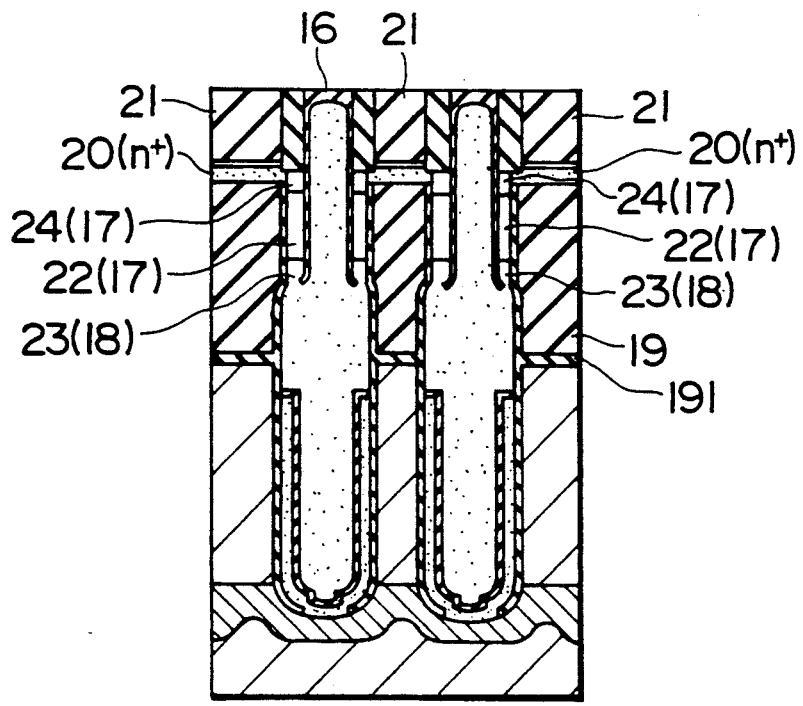
Figure 6S:
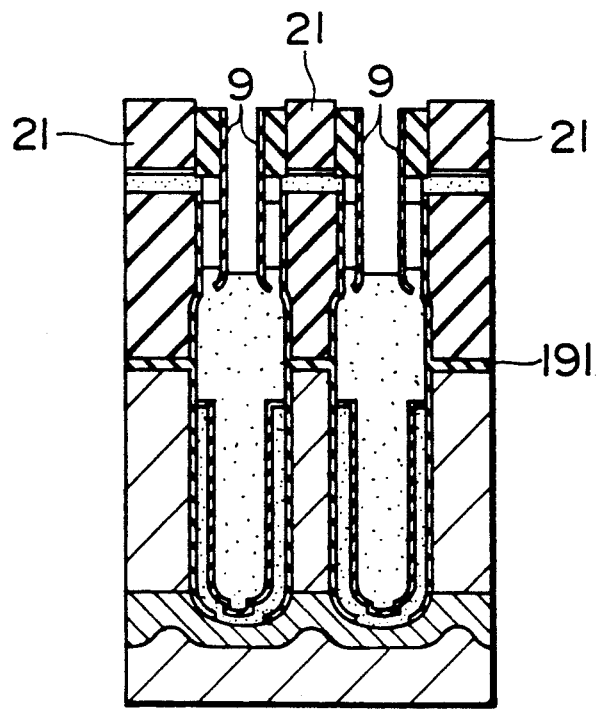
Figure 6T:
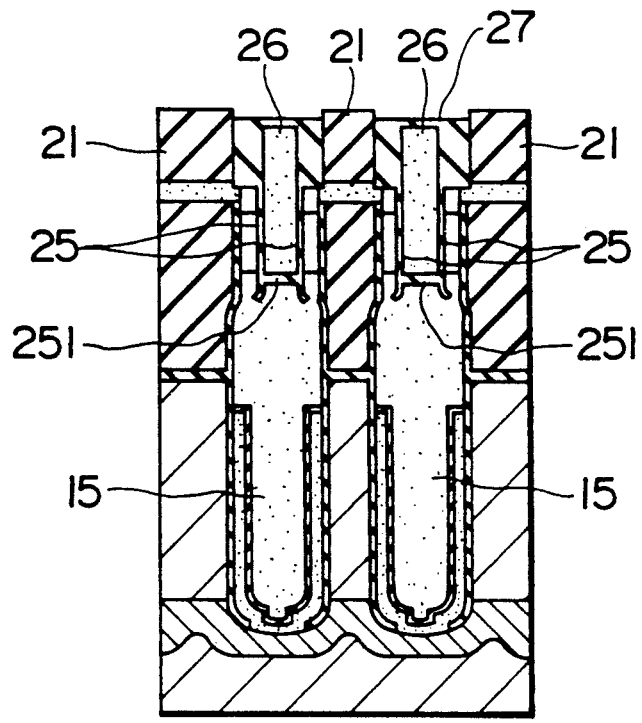
Figure 6U:
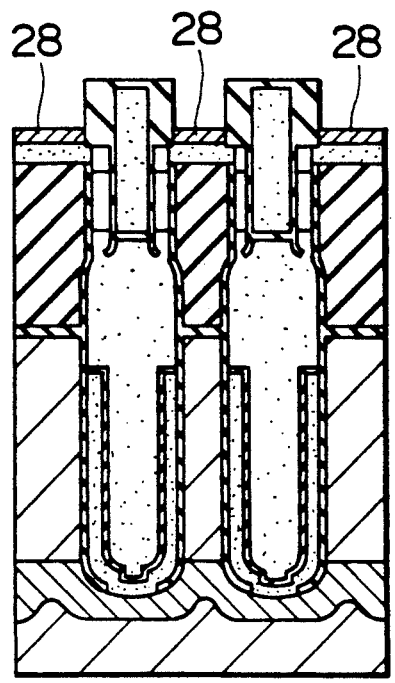
Figure 6V:
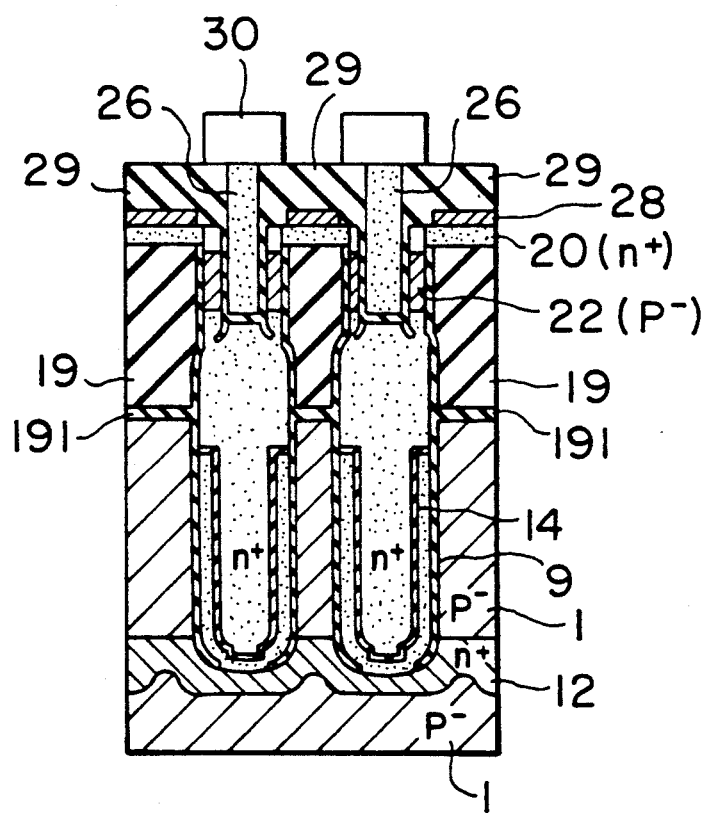
Figure 7:
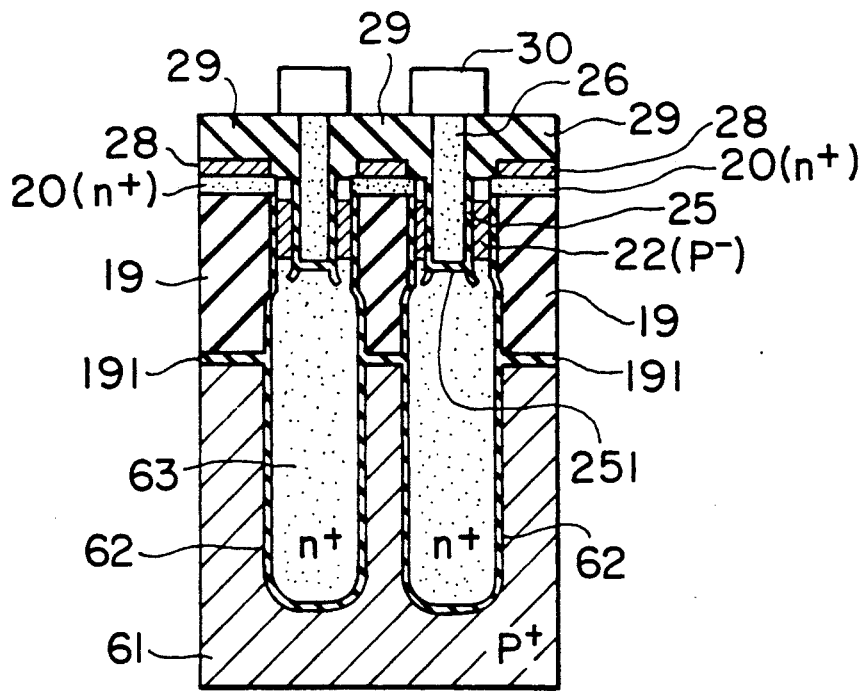
FIG. 7 is a sectional view showing a memory cell in accordance with a second embodiment of the present invention.
Figure 8:
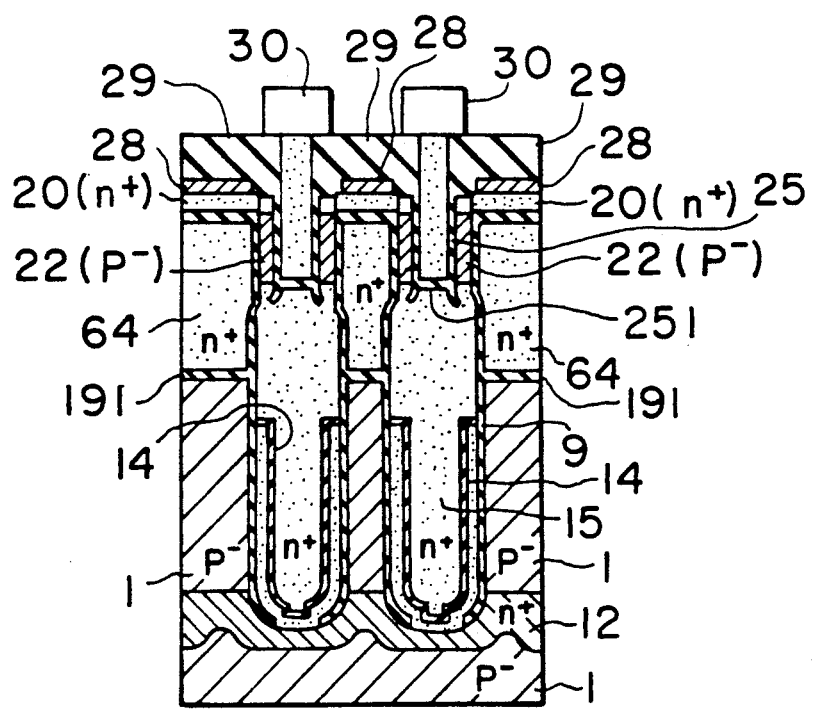
FIG. 8 is a sectional view showing a memory cell in accordance with a third embodiment of the present invention.

FIGS. 6A to 6V are sectional views showing a semiconductor memory device in accordance with a first embodiment of the present invention, FIG. 7 is a sectional view of a memory cell in accordance with a second embodiment of the present invention and FIG. 8 is a sectional view of a memory cell in accordance with a third embodiment of the present invention.

Embodiment 1

In the drawings, reference numeral 10 denotes a supporting substrate. More definitely, it is a single crystal semiconductor substrate. Reference numeral 11 denotes an electrode which is one of the electrodes of a capacitance and contains polycrystalline silicon which comes into contact with a plate electrode. Reference numeral 12 does an impurity area inside the substrate as a plate or more definitely, a diffusion layer; 14 is a capacitor insulation film; 15 is an impurity area of a channel and more definitely, a polycrystalline silicon electrode coming into contact with the diffusion layer; 19 is an insulation film; 20 is polycrystalline silicon of a bit line; 22 is a channel area; 23 and 24 are impurity areas and more definitely, diffusion areas; 25 is a gate oxide film; 26, a gate electrode; 28, a metal wiring of a bit line; 29, an inter-layer insulation film; and 30, a word line.

Hereinafter the first embodiment of the present invention will be explained with reference to FIGS. 6A to 6V. As shown in FIG. 6A, a first insulation film 2 is deposited onto a semiconductor substrate 1 of a first conductivity type and only this insulation film is etched by using a mask 65 shown in FIG. 5. In this embodiment, a silicon nitride film ($Si_3N_4$) is deposited to have a thickness of about 1 μm (FIG. 6A).

Next, a second insulation film 3 is further deposited on the silicon nitride film, and each trench 4 is made in the substrate by known anisotropic dry etching in such a manner as to leave the second insulation film on only the sidewalls of the $Si_3N_4$ film (FIG. 6B). The depth of each trench is about 1.5 μm. The kind of the first insulation film must be different from that of the second insulation film because of a later-appearing self-alignment process. This embodiment uses a silicon dioxide film ($SiO_2$) film 3. The film thickness of this $SiO_2$ film decides the thickness of a channel area and this embodiment sets the film thickness of the $SiO_2$ film to 100 nm in order to accomplish a ultra-thin film. The planar shape of this insulation film 3 becomes substantially the planar shape of a hollow pillar area which will serve as the channel area. Though the term "hollow pillar area" is used herein, the outer and inner peripheral surfaces need not be completely round. Generally, the outer and inner corners of the hollow square pillar are rounded.

Next, an about 20 nm-thick $Si_3N_4$ film 5 is deposited onto only the sidewalls in the manner already described, and the depth of the trench is further increased into the substrate 6.

This portion becomes the principal portion of the capacitor and the storage capacitance is determined by the depth and inner diameter of this trench. Its depth is set to 5 μm for the following reason. In other words, the total depth of the trench formed in the substrate is about 6.5 μm. In the manner described above, the area whose sidewalls are not covered with the $Si_3N_4$ film is formed only inside the substrate, and the inner diameter of the trench inside the substrate is further expanded by chemical etching (FIG. 6D). The size of expansion is preferably somewhat greater than the film thickness of the oxide film 3 which is deposited in FIG. 6B. A mixed solution of hydrofluoric acid and nitric acid is used for this etching. The mixing ratio is 1:400.

Next, the $Si_3N_4$ film 5 which serves as a protective film for etching described above is removed as shown in FIG. 6E and an $Si_3N_4$ film 8 which is as extremely thin as about 3 nm is deposited once again. Since this insulation film is extremely thin, it is omitted from the drawing. This very thin $Si_3N_4$ film serves as an antioxidation film as will be described elsewhere.

Next, a $SiO_2$ film 9 is deposited to a thickness of about 50 nm onto the inside wall of the trench as shown in FIG. 6F. This oxide film is the one that insulates and isolates the capacitor area. Furthermore, the bottom of the oxide film 9 is bored at a location 10 by known anisotropic dry etching in order to open the place where one of the electrodes of the capacitor comes into contact with the substrate (FIG. 6G). Thereafter polycrystalline silicon 11 which serves as one of the electrodes of the capacitor and comes into contact with the substrate 1 is deposited and an impurity of a second conductivity type is diffused through this polycrystalline silicon.

As a result, resistance of the polycrystalline silicon is reduced and an impurity area or more definitely, a diffusion layer 12, is formed in matrix inside the substrate. This diffusion layer 12 becomes a wiring of a plate electrode 11 and is connected to all the memory cells (FIG. 6H).

Furthermore, a resist film 13 is buried to a predetermined height inside the trench as shown in FIG. 6I and a polycrystalline silicon film 11 is formed as shown in FIG. 6I. After the resist is removed, a capacitor insulation film 14 is grown on the surface of the polycrystalline silicon 11 and the trench is filled back by the polycrystalline silicon 15 which serves as one of the electrodes. The capacitor insulation film 14 uses a single-layered film such as $SiO_2$ film, a $Si_3N_4$ film, a $Ta_2O_5$ film, or the like, or their laminate layered film of $SiO_2/Si/SiO_2$. The film thickness is set to 5 nm or below in order to increase the capacitance. After the trench is filled back by the polycrystalline silicon 15, the surface is made flat and an oxide film 16 is grown only on the surface of the polycrystalline silicon (FIG. 6K). In the trench having the structure described above, the inner diameter of the trench close to the substrate surface is smaller than that inside the substrate, so that the mouth is closed and a void is defined thereinside before the inside of the trench is filled completely. Even when such a void is formed, however, there is no problem for the subsequent fabrication steps. Therefore, the explanation will be continued by assuming herein that the inside is filled, for simplification.

Next, only the Si₃N₄ film on the surface is removed under the state shown in FIG. 6K and the silicon substrate is bored by use of the remaining oxide film as the mask. As the result, a thin film 17 of single crystal is formed along the trench as shown in FIG. 6L. At this time, etching of the substrate is stopped under the state where the oxide film as the shoulder of the trench is exposed.

Next, processing for connecting this single crystal substrate to the polycrystalline silicon electrodes of the capacitor is carried out. Therefore, only the exposed oxide film A on the inside wall of the trench is removed as shown in FIG. 6M.

Next, when the polycrystalline silicon 18 is thinly deposited as shown in FIG. 6N, the portion of the removed oxide film is filled. Furthermore, the polycrystalline silicon adhering to the entire sidewalls is removed. In this manner the hollow pillar-like single crystal substrate and the polycrystalline silicon of the capacitor are connected to each other and the diffusion layer as the impurity layer is formed by diffusion of the impurity from the polcrystalline silicon (FIG. 6O). In order to protect the single crystal substrate at the time of the removal of this polycrystalline silicon 18, it is possible to cover the entire portion by a thin oxide film at the stage of FIG. 6L and to prevent the polycrystalline silicon and the substrate from coming into direct contact with each other. In this instance, the removal of the oxide film on the inside wall of the trench must be carried out by anisotropic dry etching so as to leave the oxide film on the sidewalls of the substrate. Thermal oxidation is carried out under the state of FIG. 6O to dispose a silicon dioxide film 191 on the exposed surfaces 1, 17 and 18 of silicon.

Next, the cylindrical memory cell is filled back by the insulation film 19 as shown in FIG. 6P. This embodiment uses the Si₃N₄ film. Furthermore, this Si₃N₄ film is cut down and only a portion of the insulation film 191 is removed in such a manner as to expose part of the hollow cylindrical single crystal substrate as shown in FIG. 6Q. When this insulation film 191 is etched, the insulation films 3 and 16 are etched, too, but since the insulation film 191 is extremely thin, it does not render any problem. Since this step is also carried out without using the mask, the insulation film 19 must be of a different kind from the insulation films 3 and 16 covering the upper portion of the memory cell. Furthermore, polycrystalline silicon 20 as the bit line is deposited and left in such a manner as to encompass the projecting portion as shown in FIG. 6R. The diffusion layer as the impurity area is formed by the diffusion of the impurity from this polycrystalline silicon. The Si₃N₄ film 21 is deposited again on this polycrystalline silicon and is then flattened.

Next, the fabrication steps of a vertical transistor are carried out. The oxide film 6 covering the surface of the projecting portion in FIG. 6R is removed and polycrystalline silicon inside the trench is further dug as shown in FIG. 6S. The oxide film 9 covering the inside wall of the trench at this portion is removed and an oxide film 251 is grown on the surface of the exposed polycrsytalline silicon 15. The channel area must be protected in this instance but the very thin Si₃N₄ film 8 (not shown) that is deposited in FIG. 6E serves the anti-oxidation mask. Furthermore, this Si₃N₄ film 8 is removed and the gate oxide film 25 is grown and filled back by the gate electrode 26. Furthermore, an oxide film 27 is formed on the surface (FIG. 6T). After the Si₃N₄ film 21 is removed, a metal 28 such as silicide is deposited so as to reduce the resistance of the bit line and is left only around the projecting portion as shown in FIG. 6U.

Figure 5:
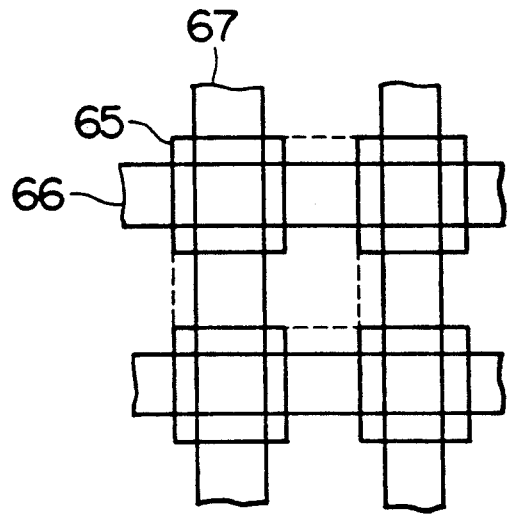
FIG. 5 is a planar layout diagram of the memory cell of the present invention.

Next, the bit line 66 is formed using the mask shown in FIG. 5. Finally, the surface is flattened by the interlayer insulation film 29 and this insulation film is etched back to expose the surface of the gate electrode. Then, an aluminum wiring 30 which will serve as the word line electrode is formed in such a manner as to come into contact with the gate electrode and the memory cell of this embodiment is thus completed (FIG. 6V).

After the fabrication steps described above, there is obtained a semiconductor memory device including a semiconductor substrate, a plurality of word lines disposed on the semiconductor substrate, a plurality of bit lines disposed on the semiconductor substrate and crossing the word lines, and a plurality of memory cells disposed on the semiconductor substrate and connected electrically to the word lines and to the bit lines; wherein each of the memory cells includes a switching transistor and a charge storage capacitor; an active area in which the channel and source/drain of the switching transistor are formed is a hollow cylindrical single crystal area which is formed in the direction of depth of the semiconductor substrate and whose outer periphery is encompassed by an insulation film; one of impurity layers as the source or drain area is connected electrically to one of the electrodes of the charge storage capacitor existing immediately below the active area; the other of the impurity layers as the drain or source area is connected electrically to the bit lines; and the memory cell includes a gate electrode formed inside the hollow cylindrical area through an insulation film disposed on the inner peripheral surface of the hollow cylindrical single crystal area.

Embodiment 2

Figure 1:
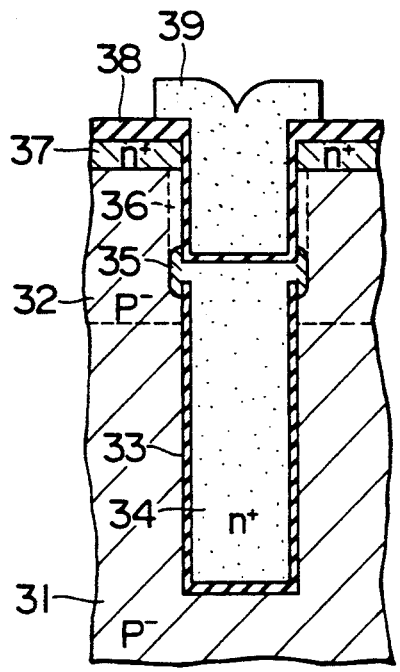
FIGS. 1, 2 and 3 are sectional views each showing a conventional vertical memory cell.
Figure 2:
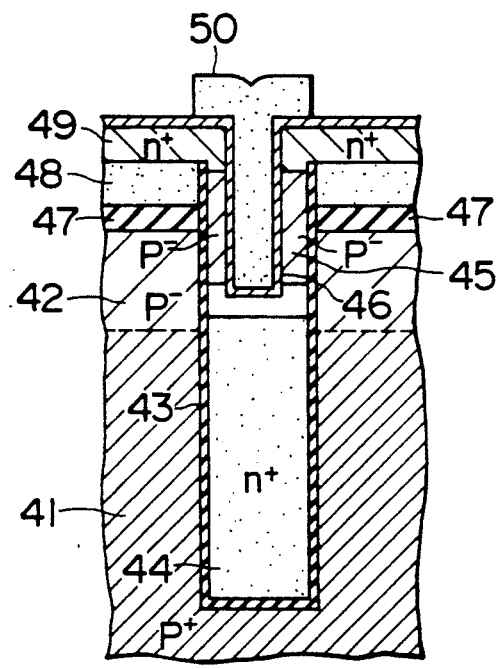
Figure 3:
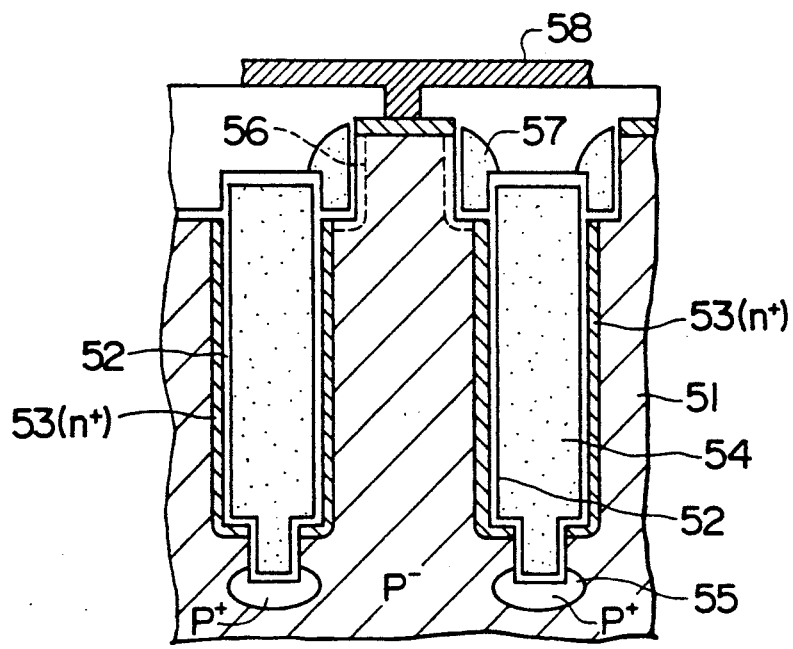
Figure 4:
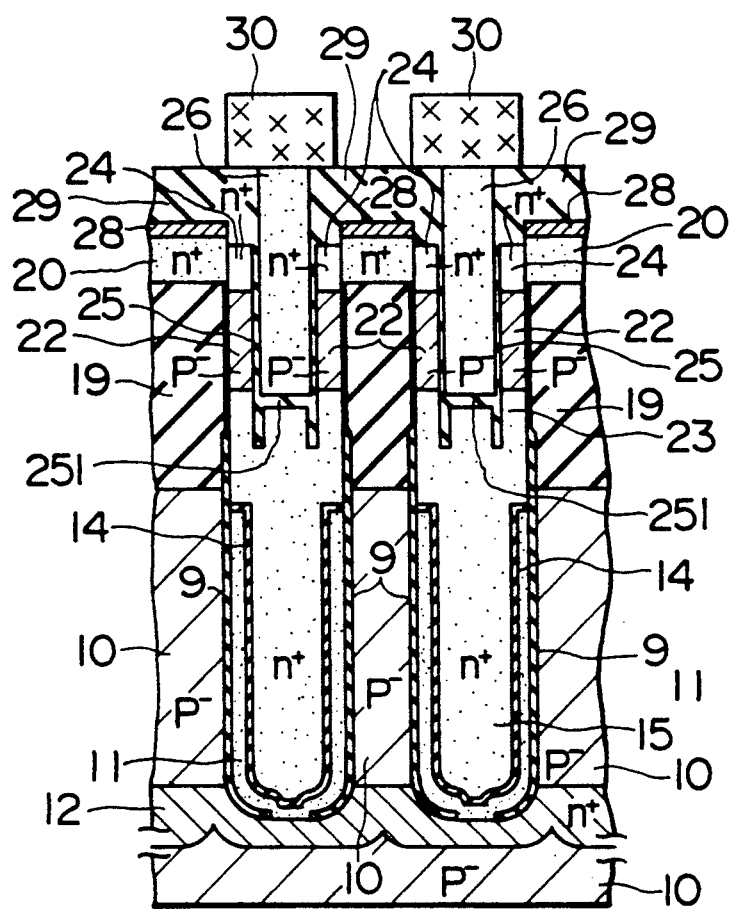
FIG. 4 is a sectional view of a memory cell in accordance with the present invention.

FIG. 7 is a sectional view showing a memory cell in accordance with a second embodiment of the present invention. Here, the principal portion of a capacitor is formed inside a high concentration substrate 61 and for this reason, the substrate can be used as a plate. Therefore, in comparison with the first embodiment shown in FIG. 1, it is not necessary to form one of the electrodes inside the trench and this trench may be merely filled by polycrystalline silicon 63. Reference numeral 62 represents a capacitor insulation film. This structure facilitates the fabrication process but in the worst case, a power supply voltage or the sum of the power supply voltage and a substrate potential is applied to the capacitor insulation film.

Since the substrate potential is either a ground potential (0 V) or a negative potential ($V_{BB}$: e.g. $-2$ V), when the potential of the capacitance electrode 63 for storing the "1" memory state reaches the power supply voltage (e.g. 3 V), the power supply voltage (e.g. 3 V) or the sum of the power supply voltage and the substrate potential (e.g. 5 V) is applied to the capacitor insulation film. This is disadvantageous for securing reliability of the capacitor insulation film which is made very thin.

Embodiment 3

FIG. 8 shows a third embodiment of the present invention. In this embodiment, the principal portion of the area 22 in which the channel is formed is encompassed by an electrically conductive layer 64. Therefore, a voltage can be applied to the area 22 in which the channel is formed by applying a predetermined voltage to this conductive layer and this arrangement is effective for limiting a leakage current on the back surface of the channel. In accordance with the present invention, the charge storage capacitor and the switching transistor can be formed without using at all the mask by merely opening the trench at the beginning. The connection between the bit line and the channel and between the gate electrode and the word line can be made by self-alignment.

As a result, a DRAM of the 256-Mbit class can be fabricated by the 0.3 μm technique which can accomplish DRAM of the 64-Mbit class. The second characterizing feature of the present invention is that the channel area of the switching transistor becomes a very thin film SOI transistor by self-alignment. Accordingly, a switching transistor having excellent short channel characteristics and having high conductance can be accomplished and the improvement in the operation speed can be expected. When the present invention is employed as described above, a memory satisfying the cell area and storage capacitance required for a Gbit class DRAM can be accomplished. It is to be understood by those skilled in the art that the foregoing description is preferred embodiments of the disclosed device and that various changes and modifications may be made in the invention without departing from the spirit and scope thereof.

We claim:

1. A semiconductor memory device including:
   a semiconductor substrate;
   a plurality of word lines disposed on said semiconductor substrate;
   a plurality of bit lines disposed on said semiconductor substrate and crossing said word lines; and
   a plurality of memory cells disposed on said semiconductor substrate and connected electrically to said word lines and to said bit lines,
   wherein each of said memory cells includes a switching transistor and a charge storage capacitor which are formed in a trench bored in said semiconductor substrate,
   wherein said charge storage capacitor is formed by a lower portion in said trench,
   wherein said switching transistor is formed by an upper portion in said trench, said upper portion being formed immediately above said lower portion in said trench,
   wherein said lower portion comprises:
      a hollow cylindrical first semiconductor region whose outer periphery is encompassed by a first insulating film,
      a second insulating film formed at an inner periphery of said hollow cylindrical first semiconductor region, and
      a second semiconductor region formed inside said inner periphery of said hollow cylindrical first semiconductor region through said second insulating film, a first electrode and a second electrode of said change storage capacitor being formed by said hollow cylindrical first semiconductor region and said second semiconductor region, respectively, and a capacitor insulating film between said first electrode and said second electrode of said charge storage capacitor being formed by said second insulating film, and
   wherein said upper portion comprises:
      a hollow cylindrical third semiconductor region whose outer periphery is encompassed by a third insulating film,
      a fourth insulating film formed at an inner periphery of said hollow cylindrical third semiconductor region, and
      a conductive region formed inside said inner periphery of said hollow cylindrical third semiconductor region through said fourth insulating film, a gate electrode of said switching transistor being formed by said conductive region and connected to a corresponding word line, one of a source region and a drain region of said switching transistor being formed by a top portion of said hollow cylindrical third semiconductor region and connected to a corresponding bit line, the other of said source region and said drain region being formed by a bottom portion of said hollow cylindrical third semiconductor region and connected to said second semiconductor region of said second electrode of said charge storage capacitor,
   wherein both said bottom portion of said hollow cylindrical third semiconductor region and said second semiconductor region form a common semiconductor region serving as a charge storage node of a memory cell, and wherein said common semiconductor region serving as said charge storage node of said memory cell is electrically isolated by said first insulating film, said second insulating film and said third insulating film from said semiconductor substrate.

2. A semiconductor memory device according to claim 1, wherein a fifth insulating film is formed between said conductive region and said common semiconductor region such that said conductive region and said common semiconductor region are isolated by said fifth insulating film, and
   wherein a sixth insulating film is formed between a bottom portion of said second semiconductor region and a surface of said semiconductor substrate at a bottom of said trench such that said second semiconductor region and said semiconductor substrate are isolated by said sixth insulating film.

3. A semiconductor memory device according to claim 2, wherein said semiconductor substrate includes a doped region whose conductivity type is opposite to that of a portion of said semiconductor substrate underlying said doped region, and
   wherein said doped region is formed in said semiconductor substrate at a predetermined depth such that a bottom of said hollow cylindrical first semiconductor region is connected electrically to said opened region.

4. A semiconductor memory device according to claim 2, wherein said memory cells are disposed regularly on said semiconductor substrate and sexist planewise immediately below point of intersection between said word lines and it lines.

5. A semiconductor memory device according to claim 3, wherein said memory cells are disposed regularly on said semiconductor substrate and exist planewise immediately below points of intersection between said word lines and bit lines.

6. A semiconductor memory device according to claim 1, wherein a thickness of said aid hollow cylindrical third semiconductor region is determined such that said hollow cylindrical third semiconductor region becomes depleted completely by an application of a voltage to said gate electrode.

7. A semiconductor memory device according to claim 2, wherein a thickness of said hollow cylindrical third semiconductor region is determined such that said hollow cylindrical third semiconductor region becomes depleted completely by an application of a voltage to said gate electrode.

8. A semiconductor memory device according to claim 3, wherein a thickness of said hollow cylindrical third semiconductor region is determined such that said hollow cylindrical third semiconductor region becomes depleted completely by an application of a voltage to said gate electrode.

9. A semiconductor memory device according to claim 4, wherein a thickness of said hollow cylindrical third semiconductor region is determined such that said hollow cylindrical third semiconductor region becomes depleted completely by an application of a voltage to said gate electrode.

10. A semiconductor memory device according to claim 5, wherein a thickness of said hollow cylindrical third semiconductor region is determined such that said hollow cylindrical third semiconductor region becomes depleted completely by an application of a voltage to said gate electrode.

11. A semiconductor memory device including:
a semiconductor substrate;
a plurality of word lines disposed on said semiconductor substrate;
a plurality of bit lines disposed on said semiconductor substrate and crossing said word lines; and
a plurality of memory cells disposed on said semiconductor substrate and connected electrically to said word lines and to said bit lines;
wherein each of said memory cells includes a switching transistor and a charge storage capacitor which are formed in a trench bored in said semiconductor substrate,
wherein said charge storage capacitor is formed by a lower portion in said trench,
wherein said switching transistor is formed by an upper portion in said trench, said upper portion being formed immediately above said lower portion in said trench,
wherein said lower portion comprises:
a hollow sheathlike first semiconductor region whose outer periphery is encompassed by a first insulating film,
a second insulating film formed at an inner periphery of said hollow sheathlike first semiconductor region, and
a second semiconductor region formed inside said inner periphery of said hollow sheathlike first semiconductor region through said second insulating film, a first electrode and a second electrode of said charge storage capacitor being formed by said hollow sheathlike first semiconductor region and said second semiconductor region, respectively, and a capacitor insulating film between said first electrode and said second electrode of said charge storage capacitor being formed by said second insulating film, and
wherein said upper potion comprises:
a hollow sheathlike third semiconductor region whose outer periphery is encompassed by a third insulating film,
a fourth insulating film formed at an inner periphery of said hollow sheathlike third semiconductor region, and
a conductive region formed inside said inner periphery of said hollow sheathlike third semiconductor region through said fourth insulating film, a gate electrode of said switching transistor being formed by said conductive region and connected to a corresponding word line, one of a source region and a drain region of said switching transistor being formed by a top portion of said hollow sheathlike third semiconductor region and connected to a corresponding it line, the other of said source region and said drain region being formed by a bottom portion of said hollow sheathlike third semiconductor region and connected to said second semiconductor region of said second electrode of said charge storage capacitor,
wherein both said bottom portion of said hollow sheathlike third semiconductor region and said second semiconductor region form a common semiconductor region serving as a charge storage node of a memory cell, and wherein said common semiconductor region serving as said charge storage node of said memory cell is electrically isolated by said first insulating film, said second insulating film and said third insulating film from said semiconductor substrate.

12. A semiconductor memory device according to claim 11, wherein a fifth insulating film is formed between said conductive region and said common semiconductor region such that said conductive region and said common semiconductor region are isolated by said fifth insulating film, and
wherein a sixth insulating film is formed between a bottom portion of said second semiconductor region and a surface of said semiconductor substrate at a bottom of said trench such that said second semiconductor region and said semiconductor substrate are isolated by said sixth insulating film.

13. A semiconductor memory device according to claim 12, wherein said semiconductor substrate includes a doped region whose conductivity taupe is opposite to that of a portion of said semiconductor substrate underlying said opened region, and
wherein said doped region is formed in said semiconductor substrate at a predetermined depth such that a bottom of said hollow sheathlike first semiconductor region is connected electrically to said doped region.

14. A semiconductor memory device according to claim 12 wherein said memory cells are disposed regularly on said semiconductor substrate and exit planewise immediately below points of intersection between said word lines and bit lines.

15. A semiconductor memory device according to claim 13, wherein said memory cells are disposed regularly on said semiconductor substrate and exist planewise immediately below points of intersection between said word lines and bit lines.

16. A semiconductor memory device according to claim 11, wherein a thickness of said hollow sheathlike third semiconductor region is determined such that said hollow sheathlike third semiconductor region becomes depleted completely by an application of a voltage to said gate electrode.

17. A semiconductor memory device according to claim 12, wherein a thickness of said hollow sheathlike third semiconductor region is determined such that said hollow sheathlike third semiconductor region becomes depleted completely by an application of a voltage to said gate electrode.

18. A semiconductor memory device according to claim 13, wherein a thickness of said hollow sheathlike third semiconductor region is determined such that said hollow sheathlike third semiconductor region becomes depleted completely by an application of a voltage to said gate electrode.

19. A semiconductor memory device according to claim 14, wherein a thickness of said hollow sheathlike third semiconductor region is determined such that said hollow sheathlike third semiconductor region becomes depleted completely by an application of a voltage to said gate electrode.

20. A semiconductor memory device according to claim 15, wherein a thickness of said hollow sheathlike third semiconductor region is determined such that said hollow sheathlike third semiconductor region becomes depleted completely by an application of a voltage to said gate electrode.

* * * * *